United States Patent
Jung et al.

(10) Patent No.: US 8,143,918 B2
(45) Date of Patent: Mar. 27, 2012

(54) APPARATUS FOR DRIVING A DISPLAY DEVICE, DISPLAY DEVICE INCLUDING THE SAME, AND METHOD THEREOF

(75) Inventors: Kwan-Wook Jung, Suwon-si (KR); Seung-Gyu Tae, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 968 days.

(21) Appl. No.: 12/131,464

(22) Filed: Jun. 2, 2008

(65) Prior Publication Data

US 2008/0297495 A1    Dec. 4, 2008

(30) Foreign Application Priority Data

Jun. 4, 2007  (KR) .................. 10-2007-0054294

(51) Int. Cl.
*G02F 1/133* (2006.01)
*G09G 3/36* (2006.01)

(52) U.S. Cl. ............... 326/82; 326/40; 345/98; 345/100

(58) Field of Classification Search .................... 326/82, 326/83, 40; 345/98, 100, 173, 204
See application file for complete search history.

(56) References Cited

U.S. PATENT DOCUMENTS

| | | | |
|---|---|---|---|
| 6,611,248 B2 | 8/2003 | Kanbara et al. | |
| 6,845,140 B2 | 1/2005 | Moon et al. | |
| 7,038,653 B2 | 5/2006 | Moon | |
| 7,120,221 B2 | 10/2006 | Moon | |
| 2006/0210012 A1 | 9/2006 | Yamaguchi et al. | |
| 2007/0040792 A1* | 2/2007 | Kwag et al. | 345/100 |
| 2008/0012816 A1* | 1/2008 | Moon | 345/100 |

FOREIGN PATENT DOCUMENTS

| | | |
|---|---|---|
| JP | 2001-014881 | 1/2001 |
| JP | 2001-350438 | 12/2001 |
| JP | 2002-055644 | 2/2002 |
| JP | 2004-103226 | 4/2004 |
| JP | 2005-149624 | 6/2005 |
| KR | 1020030032199 A | 4/2003 |
| KR | 100393750 | 7/2003 |
| KR | 1020030079569 A | 10/2003 |
| KR | 1020040022358 A | 3/2004 |
| KR | 1020050114850 A | 12/2005 |
| KR | 1020060079043 A | 7/2006 |

* cited by examiner

*Primary Examiner* — Daniel D Chang
(74) *Attorney, Agent, or Firm* — Cantor Colburn LLP

(57) ABSTRACT

An apparatus for driving a display device includes a plurality of stage connected to each other, wherein each stage includes first to seventh transistors and first and second capacitors, the seventh transistor is connected to one terminal of the first capacitor, and a ratio of an area of the first capacitor to a channel width of the seventh transistor is less than 40. Accordingly, since the ratio of the area of the capacitor to the channel width of the transistor is less than 40, deterioration may be remarkably reduced in a low temperature test.

15 Claims, 7 Drawing Sheets

| Sample | T4(W) | T5(W) | T7(W) | C1(A) | C1/T7 | C1/(T4+T5) | Deterioration |
|---|---|---|---|---|---|---|---|
| 2.2"CIF | 100 | 300 | 100 | 3933 | 39.330 | 9.833 | No |
| 2.46"TF | 100 | 300 | 100 | 4133 | 41.330 | 10.333 | Yes |
| 5.0"VGA | 500 | 800 | 300 | 16933 | 56.443 | 13.025 | Yes |
| 1.82"MTR | 150 | 350 | 150 | 4000 | 26.667 | 8.000 | No |
| 1.9"STR | 100 | 250 | 150 | 2533 | 16.887 | 7.237 | No |
| 2.3" S3 | 100 | 440 | 100 | 4533 | 45.330 | 8.394 | No |
| 2.5"DSC | 100 | 350 | 100 | 4133 | 41.330 | 9.184 | No |
| 3.5"PMP 1CHIP | 200 | 600 | 230 | 10600 | 41.087 | 13.250 | No |
| 1.71"TMR QCIF | 100 | 250 | 150 | 2400 | 16.000 | 6.857 | No |
| 2.2" RAZR | 100 | 250 | 150 | 2600 | 17.333 | 7.429 | No |
| 4.0"Triple-gate TF | 150 | 500 | 135 | 7000 | 51.852 | 10.769 | No |
| 2.56" RIM | 100 | 380 | 100 | 4133 | 41.330 | 8.610 | No |
| 1.66" QCIF | 100 | 350 | 100 | 3867 | 38.670 | 8.593 | No |
| 2.22" CCR | 100 | 220 | 100 | 4333 | 43.330 | 13.541 | No |
| 2.83" LAND | 100 | 350 | 100 | 4133 | 41.330 | 9.184 | No |
| 4.0" Triple | 150 | 500 | 150 | 7000 | 46.667 | 10.769 | Yes |
| 7.0" Triple | 200 | 600 | 200 | 6467 | 32.335 | 8.084 | No |
| 1.8"_LANDSCAPE | 100 | 250 | 100 | 3600 | 36.000 | 10.286 | No |
| 1.55"QCIF | 100 | 250 | 100 | 2267 | 22.670 | 6.477 | No |
| 1.2"QQF04 | 100 | 250 | 100 | 2200 | 22.000 | 6.286 | Yes |
| 1.46QCIF | 100 | 220 | 100 | 5000 | 50.000 | 15.625 | Yes |
| 2.0QV_KAISER | 100 | 490 | 100 | 4200 | 42.000 | 7.119 | No |
| 2.3"GVGA | 100 | 330 | 100 | 4600 | 46.000 | 10.698 | No |
| 2.46"TF(Tomtom) | 100 | 640 | 100 | 7333 | 73.330 | 9.909 | No |

FIG.8

|  | T4(W) | T5(W) | T7(W) | C1(A) | C1/T7 | C1/(T4+T5) |
|---|---|---|---|---|---|---|
| 4.0″ TMR before increasing | 150 | 500 | 150 | 6400 | 42.667 | 9.846 |
| 4.0″ TMR after increasing | 150 | 500 | 170 | 6400 | 37.647 | 9.846 |

APPARATUS FOR DRIVING A DISPLAY DEVICE, DISPLAY DEVICE INCLUDING THE SAME, AND METHOD THEREOF

This application claims priority to Korean Patent Application No. 10-2007-0054294, filed on Jun. 4, 2007, and all the benefits accruing therefrom under 35 U.S.C. §119, the contents of which in its entirety are herein incorporated by reference.

BACKGROUND OF THE INVENTION (a) Field of the Invention

The present invention relates to an apparatus for driving a display device, a display device including the same, and a method thereof. More particularly, the present invention relates to an apparatus for driving a display device that experiences reduced deterioration during a low temperature test, a display device including the same, and a method thereof.

(b) Description of the Related Art

Recently, flat panel display devices such as organic light emitting diode ("OLED") display devices, plasma display panel ("PDP") devices, and liquid crystal display ("LCD") devices have been actively developed as substitutes for heavy and large cathode ray tubes ("CRTs").

The PDP device is a device for displaying characters or images by using plasma generated from gas discharge, and the OLED device is a device for displaying characters or images by using electroluminescence of specific organic materials or specific polymers. The LCD device is a device for displaying characters or images by applying an electric field to a liquid crystal layer disposed between two panels and controlling strength of the electric field to adjust the transmittance of light passing through the liquid crystal layer.

Among the display devices outlined above, the LCD device includes a pixel including a switching device, a display panel including a display signal line, a gate driver for turning on/off the switching device of the pixel by sending out a gate on/off voltage to gate lines among the display signal lines, and a data driver for sending out a data voltage to data lines among the display signal lines to apply the data voltage to the pixel through the turned-on switching device.

In a large display device, along with a middle or small sized display device, the gate driver, which may be formed by a same process for forming the switching device of the pixel, may be integrated with the display panel.

The gate driver, substantially a shift register, includes a plurality of stages that are connected to each other and aligned in a line. A first stage receives a scan start signal and outputs a gate output, while simultaneously sending out a carry output to the next stage to sequentially generate a gate output. The gate output may be used as the carry output.

Here, the stages include a plurality of transistors, but the driving current of the transistors may be changed according to temperature, and output deterioration of the shift register may be generated due to various reasons.

Accordingly, in consideration of these points, the deterioration of the stages has previously been detected via a low temperature test in the manufacturing process.

BRIEF SUMMARY OF THE INVENTION

According to the present invention, it has been determined herein that since the shift register that is adjusted according to a conventional design rule has various deteriorations, the establishment of a new design rule is needed.

The present invention provides an apparatus for driving a display device and a display device including the same that is adjusted by a new design rule. The present invention also provides a method for manufacturing an apparatus for driving a display device.

An apparatus for driving a display device according to exemplary embodiments of the present invention includes a plurality of stages connected to each other, wherein each stage includes first to seventh transistors and first and second capacitors, the seventh transistor being connected to one terminal of the first capacitor, and a ratio of an area of the first capacitor to a channel width of the seventh transistor is less than 40.

The overlapping distance between a control terminal (a gate) and an output terminal (a source) of the seventh transistor may be about 4 μm.

Each stage may include a set terminal, a reset terminal, a gate voltage terminal, a gate output terminal, and first and second clock terminals.

The first transistor may be connected between the first clock terminal and the gate output terminal and may include a control terminal connected to a first contact point, the second transistor may include a control terminal and an input terminal commonly connected to the set terminal and an output terminal connected to the first contact point, the third transistor may be connected between the first contact point and the gate voltage terminal and may include a control terminal connected to the reset terminal, the fourth transistor may be connected between the first contact point and the gate voltage terminal and may include a control terminal connected to a second contact point, the fifth transistor may be connected between the gate output terminal and the gate voltage terminal and may include a control terminal connected to the second contact point, the sixth transistor may be connected between the gate output terminal and the first gate voltage terminal and may include a control terminal connected to the second clock terminal, the seventh transistor may be connected between the second contact point and the gate voltage terminal and may include a control terminal connected to the first contact point, the first capacitor may be connected between the first clock terminal and the second contact point, and the second capacitor may be connected between the first contact point and the gate output terminal.

The stages may be integrated with the display device.

An apparatus for driving a display device according to other exemplary embodiments of the present invention includes a plurality of stages connected to each other, wherein each stage includes first to seventh transistors and first and second capacitors, the fourth and fifth transistors are commonly connected to one terminal of the first capacitor, and a ratio of an area of the first capacitor to a sum of channel widths of the fourth and fifth transistors is more than 7. The overlapping distance between a control terminal (gate) and an output terminal (source) of each of the fourth and fifth transistors may be about 4 μm.

Each stage may include a set terminal, a reset terminal, a gate voltage terminal, a gate output terminal, and first and second clock terminals.

The first transistor may be connected between the first clock terminal and the gate output terminal and may include a control terminal connected to a first contact point, the second transistor may include a control terminal and an input terminal commonly connected to the set terminal and an output terminal connected to the first contact point, the third transistor may be connected between the first contact point and the gate voltage terminal and may include a control terminal connected to the reset terminal, the fourth transistor may be connected between the first contact point and the gate voltage terminal and may include a control terminal connected to a second contact point, the fifth transistor may be connected between the gate output terminal and the gate voltage terminal and may include a control terminal connected to the second contact point, the sixth transistor may be connected between the gate output terminal and the first gate voltage terminal and may include a control terminal connected to the second clock terminal, the seventh transistor may be connected between the second contact point and the gate voltage terminal and may include a control terminal connected to the first contact point, the first capacitor may be connected between the first clock terminal and the second contact point, and the second capacitor may be connected between the first contact point and the gate output terminal.

The stages may be integrated with the display device.

In a display device according to exemplary embodiments of the present invention having a gate driver including a plurality of stages connected to each other, each stage includes first to seventh transistors and first and second capacitors, the seventh transistor is connected to one terminal of the first capacitor, and a ratio of an area of the first capacitor to a channel width of the seventh transistor is less than 40.

The overlapping distance between a control terminal (a gate) and an output terminal (a source) of the seventh transistor may be about 4 μm.

Each stage may include a set terminal, a reset terminal, a gate voltage terminal, a gate output terminal, and first and second clock terminals.

The first transistor may be connected between the first clock terminal and the gate output terminal and may include a control terminal connected to a first contact point, the second transistor may include a control terminal and an input terminal commonly connected to the set terminal and an output terminal connected to the first contact point, the third transistor may be connected between the first contact point and the gate voltage terminal and may include a control terminal connected to the reset terminal, the fourth transistor may be connected between the first contact point and the gate voltage terminal and includes a control terminal connected to a second contact point, the fifth transistor may be connected between the gate output terminal and the gate voltage terminal and may include a control terminal connected to the second contact point, the sixth transistor may be connected between the gate output terminal and the first gate voltage terminal and may include a control terminal connected to the second clock terminal, the seventh transistor may be connected between the second contact point and the gate voltage terminal and may include a control terminal connected to the first contact point, the first capacitor may be connected between the first clock terminal and the second contact point, and the second capacitor may be connected between the first contact point and the gate output terminal.

The gate driver may be integrated with the display device.

In a display device according to other exemplary embodiments of the present invention having a gate driver including a plurality of stages connected to each other, each stage includes first to seventh transistors and first and second capacitors, the fourth and fifth transistors are commonly connected to one terminal of the first capacitor, and a ratio of an area of the first capacitor to a sum of channel widths of the fourth and fifth transistors is more than 7. The overlapping distance between a control terminal (gate) and an output terminal (source) of each of the fourth and fifth transistors may be about 4 μm.

Each stage may include a set terminal, a reset terminal, a gate voltage terminal, a gate output terminal, and first and second clock terminals.

The first transistor may be connected between the first clock terminal and the gate output terminal and may include a control terminal connected to a first contact point, the second transistor may include a control terminal and an input terminal commonly connected to the set terminal and an output terminal connected to the first contact point, the third transistor may be connected between the first contact point and the gate voltage terminal and may include a control terminal connected to the reset terminal, the fourth transistor may be connected between the first contact point and the gate voltage terminal and may include a control terminal connected to a second contact point, the fifth transistor may be connected between the gate output terminal and the gate voltage terminal and may include a control terminal connected to the second contact point, the sixth transistor may be connected between the gate output terminal and the first gate voltage terminal and may include a control terminal connected to the second clock terminal, the seventh transistor may be connected between the second contact point and the gate voltage terminal and may include a control terminal connected to the first contact point, the first capacitor may be connected between the first clock terminal and the second contact point, and the second capacitor may be connected between the first contact point and the gate output terminal.

The gate driver may be integrated with the display device.

According to still other exemplary embodiments of the present invention, a method of manufacturing an apparatus for driving a display device includes forming a plurality of stages within the apparatus, each stage including first to seventh transistors and first and second capacitors, and the seventh transistor is connected to one terminal of the first capacitor in each stage, and forming each stage including at least one of a ratio of an area of the first capacitor to a channel width of the seventh transistor being less than 40 and a ratio of an area of the first capacitor to a sum of the channel widths of the fourth and the fifth transistors being more than 7, wherein deterioration of the stages is not detected in a low temperature test.

BRIEF DESCRIPTION OF THE DRAWINGS

The accompanying drawings briefly described below illustrate exemplary embodiments of the present invention and, together with the description, serve to explain the principles of the present invention.

FIG. 7 is a table showing a low temperature test result for various exemplary LCDs.

FIG. 8 is a table comparing test results of the exemplary LCD before and after the application of the design rule according to an exemplary embodiment of the present invention.

DETAILED DESCRIPTION OF THE INVENTION

Figure 1:
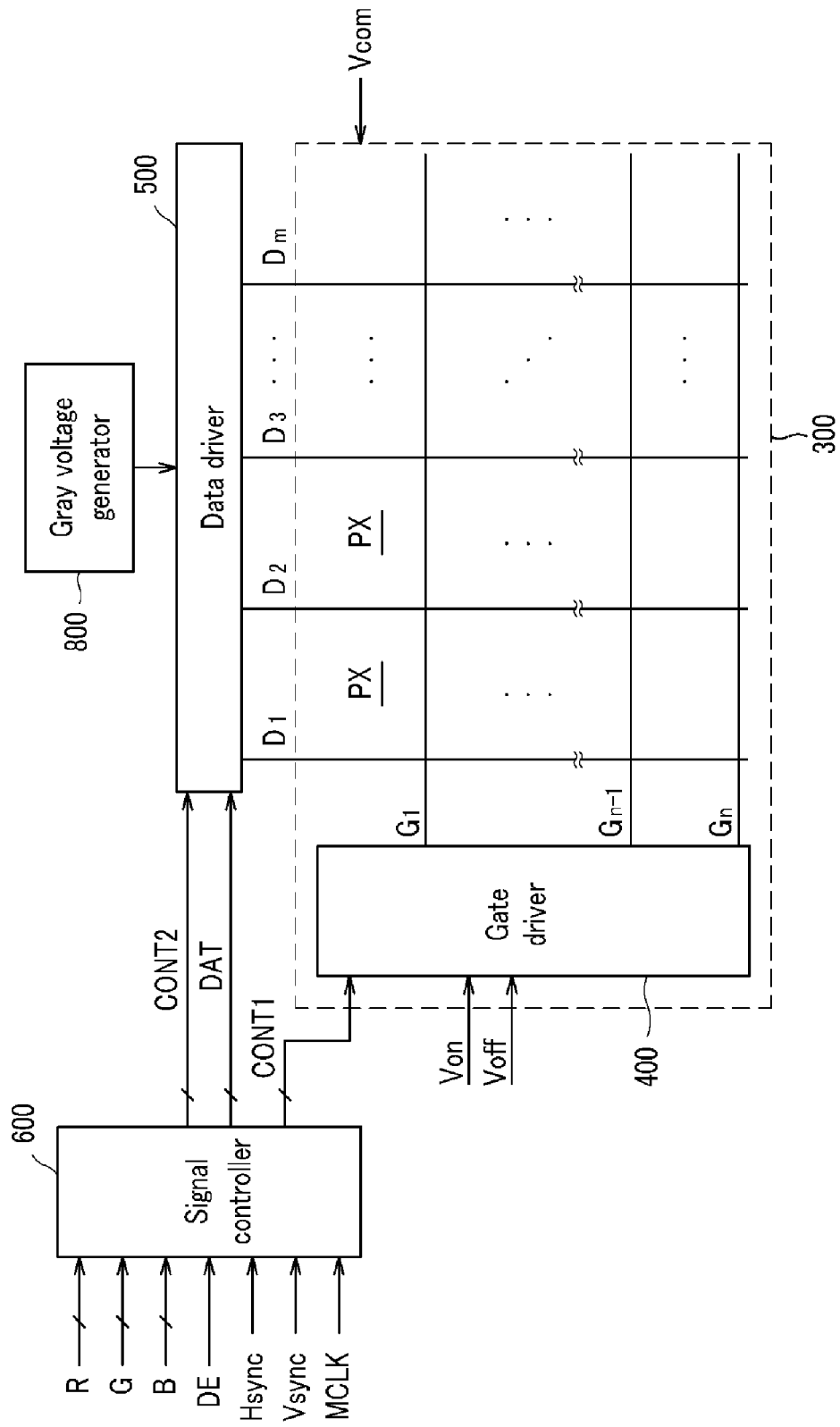
FIG. 1 is a block diagram of an exemplary liquid crystal display ("LCD") according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

First, a display device according to an exemplary embodiment of the present invention will be described in detail with reference to FIGS. 1 and 2, and an exemplary case for a liquid crystal display ("LCD") will be described.

Figure 2:
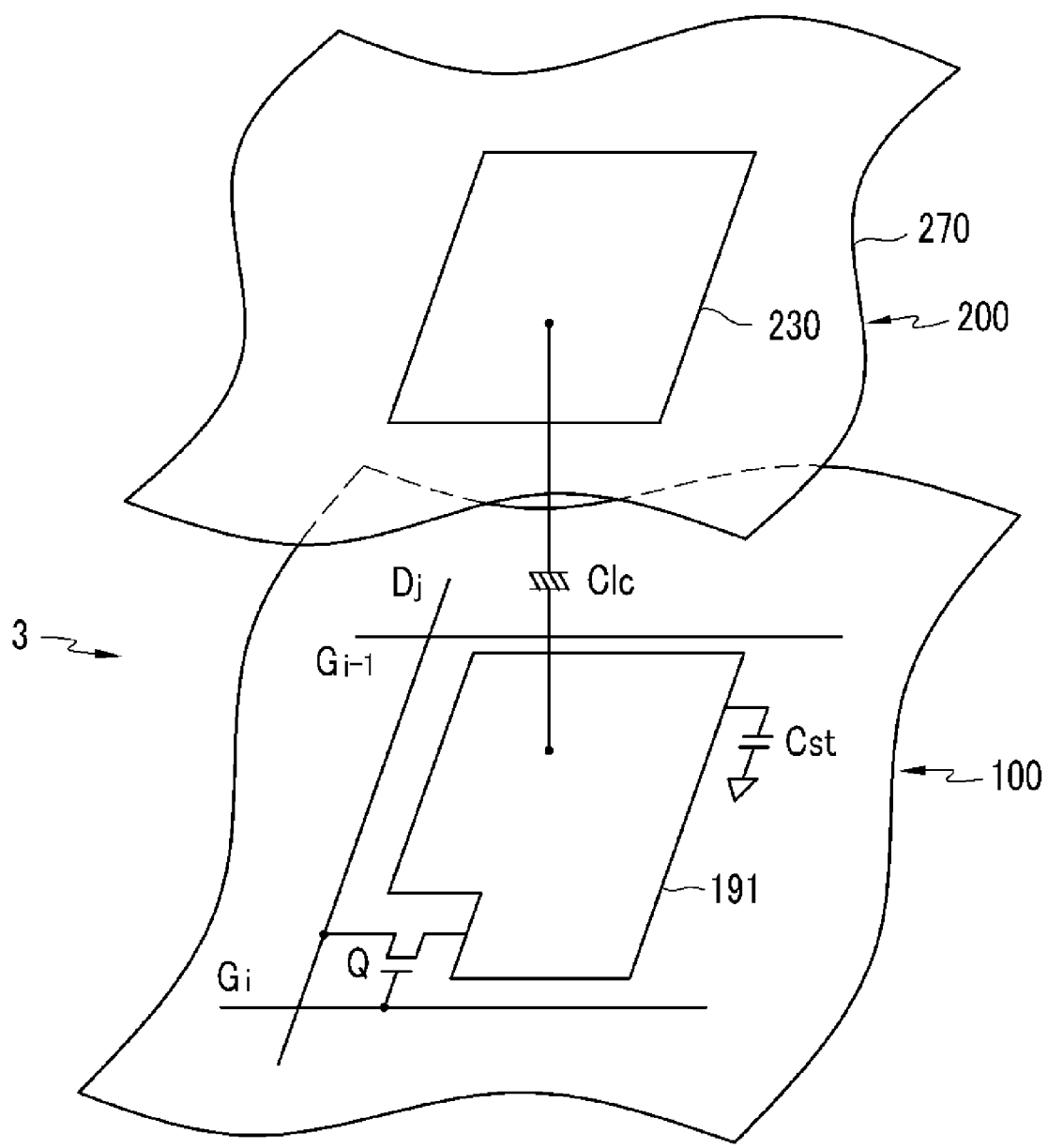
FIG. 2 is an equivalent circuit diagram of an exemplary pixel of an exemplary LCD according to an exemplary embodiment of the present invention.

FIG. 1 is a block diagram of an exemplary LCD according to an exemplary embodiment of the present invention, and FIG. 2 is an equivalent circuit diagram for an exemplary pixel of an exemplary LCD according to an exemplary embodiment of the present invention.

As shown in FIG. 1, an exemplary LCD according to an exemplary embodiment of the present invention includes a liquid crystal panel assembly 300, gate and data drivers 400 and 500 that are connected to the liquid crystal panel assembly 300, a grayscale voltage generator 800 that is connected to the data driver 500, and a signal controller 600 that controls the above-described circuits.

The liquid crystal panel assembly 300 includes a plurality of signal lines $G_1$ to $G_n$ and $D_1$ to $D_m$ and a plurality of pixels PX that are connected to the plurality of signal lines and arranged in a matrix form, in terms of an equivalent circuit. The liquid crystal panel assembly 300 includes lower and upper display panels 100 and 200 facing each other and a liquid crystal layer 3 disposed therebetween, with reference to the structure illustrated in FIG. 2.

The signal lines $G_1$ to $G_n$ and $D_1$ to $D_m$ include a plurality of gate lines $G_1$ to $G_n$ for delivering gate signals (also referred to as scan signals) and a plurality of data lines $D_1$ to $D_m$ for delivering data signals. The gate lines $G_1$ to $G_n$ extend in an approximate row direction, a first direction, and are almost parallel to each other, and the data lines $D_1$ to $D_m$ extend in a column direction, a second direction, and almost parallel to each other. The second direction may be substantially perpendicular to the first direction.

Each pixel, for example a pixel PX connected to an i-th (I=1, 2, n) gate line $G_i$ and a j-th (j=1, 2, m) data line $D_j$, includes a switching device Q that is connected to a signal line ($G_i$, $D_j$), a liquid crystal capacitor Clc that is connected to the switching device Q, and a storage capacitor Cst. In an alternative exemplary embodiment, the storage capacitor Cst may be omitted if necessary.

The switching device Q is a device having three terminals included in the lower display panel 100, such as a thin film transistor ("TFT"). In the switching device Q, a control terminal, such as a gate electrode, is connected to a gate line $G_i$, an input terminal, such as a source electrode, is connected to a data line $D_j$, and an output terminal, such as a drain electrode, is connected to the liquid crystal capacitor Clc and the storage capacitor Cst.

The liquid crystal capacitor Clc has a pixel electrode 191 of the lower display panel 100 and a common electrode 270 of the upper display panel as two terminals, and the liquid crystal layer 3 between the two electrodes 191 and 270 functions as a dielectric. The pixel electrode 191 is connected to the switching device Q. The common electrode 270 is formed on a front side of the upper display panel 200, and a common voltage Vcom is applied to the common electrode 270. In an alternative exemplary embodiment, the common electrode 270 may be included in the lower display panel 100, differently from a case illustrated in FIG. 2, and in that case, at least one of the two electrodes 191 and 270 may be formed in a shape of a line or a bar.

The storage capacitor Cst, which supports the function of the liquid crystal capacitor Clc, is formed by overlapping a separate signal line (not shown) included in the lower display panel 100 and the pixel electrode 191 with an insulator interposed therebetween. A predetermined voltage such as the common voltage Vcom is applied to the separate signal line. However, the storage capacitor Cst may be formed by overlapping the pixel electrode 191 and a previous gate line with an insulator interposed therebetween.

For color display, each pixel PX may uniquely display one color in a set of colors, such as primary colors, which is called spatial division, or alternatively each of the pixels may alternately display one of the colors at a time, which is called temporal division. A desired color can be recognized by a spatial or temporal sum of the colors. An example of the colors includes primary colors, and may include three colors including red, green, and blue colors. FIG. 2 is an example of the spatial division. As shown in the figure, each of the pixels PX includes a color filter 230 representing one of the colors and that is disposed in a region of the upper display panel 200 corresponding to a pixel electrode 191. In an alternative exemplary embodiment, unlike FIG. 2, the color filter 230 may be formed above or below the pixel electrode 191 on the lower display panel 100.

At least one polarizer (not shown) for polarizing light may be attached to an outer surface of the liquid crystal panel assembly 300.

Referring again to FIG. 1, the grayscale voltage generator 800 generates two grayscale voltages sets (or reference grayscale voltage sets) that are related to transmittance of the pixels PX. Between the two grayscale voltage sets, one grayscale voltage set has a positive value with respect to the common voltage Vcom, and the other grayscale voltage set has a negative value with respect to the common voltage Vcom.

The gate driver 400 is integrated with the liquid crystal panel assembly 300 and connected to the gate lines $G_1$ to $G_n$. The gate driver 400 applies a gate signal including a combination of a gate-on voltage Von and a gate-off voltage Voff to the gate lines $G_1$ to $G_n$.

The data driver 500 is connected to the data lines $D_1$ to $D_m$ of the liquid crystal panel assembly 300. The data driver 500 selects a grayscale voltage generated by the grayscale voltage generator 800 and applies the selected grayscale voltage to the data lines $D_1$ to $D_m$ as data signals. Alternatively, in a case where the grayscale voltage generator 800 generates only a predetermined number of reference grayscale voltages instead of all the grayscale voltages, the data driver 500 may generate the grayscale voltages for all the grayscale voltages by dividing the reference grayscale voltages and select the data signals among the generated grayscale voltages.

The signal controller 600 controls the gate driver 400, the data driver 500, and the like.

Each of the drivers 500, 600, and 800, except for the gate driver 400, may be installed directly on the liquid crystal panel assembly 300 in the form of at least one integrated circuit ("IC") chip. Alternatively, each of the drivers 500, 600, and 800 may be installed on a flexible printed circuit film (not shown) to be attached to the liquid crystal panel assembly 300 in the form of a tape carrier package ("TCP") or installed on a separate printed circuit board ("PCB", not shown). Alternatively, the drivers 500, 600, and 800 may be integrated with the liquid crystal panel assembly 300 together with the signal lines $G_1$ to $G_n$ and $D_1$ to $D_m$, the TFT switching device, and the like. In addition, the drivers 500, 600, and 800 may be integrated as a single chip. In this case, at least one of the drivers 500, 600, and 800 or at least one circuit element forming the drivers 500, 600, and 800 may be formed outside the single chip.

The operations of the LCD device will now be described in detail.

The signal controller 600 receives input image signals R, G, and B and input control signals for controlling display of the input image signals R, G, and B from an external graphics controller (not shown). Examples of the input control signals include a vertical synchronization signal Vsync, a horizontal synchronization signal Hsync, a main clock signal MCLK, and a data enable signal DE.

The signal controller 600 processes the input image signals R, G, and B according to an operating condition of the liquid crystal panel assembly 300 based on the input image signals R, G, and B and the input control signals to generate a gate control signal CONT1, a data control signal CONT2, and the like, and thereafter sends the generated gate control signal CONT1 to the gate driver 400 and the generated data control signal CONT2 and the processed image signal DAT to the data driver 500.

The gate control signal CONT1 includes scan start signals ST1 and ST2 for indicating scan start, and at least one clock signal CLK1 or CLK2 for controlling an output period of the gate-on voltage Von. The gate control signal CONT1 may further include an output enable signal OE for limiting a duration time of the gate-on voltage Von.

The data control signal CONT2 includes a horizontal synchronization start signal STH for indicating initiation of data transmission for a row [group] of pixels PX, a load signal LOAD for requesting to apply data signals to the data lines $D_1$ to $D_m$, and a data clock signal HCLK. The data control signal CONT2 may further include a reverse signal RVS for inverting voltage polarity of the data signal with respect to the common voltage Vcom (hereinafter, "voltage polarity of the data signal with respect to the common voltage" is abbreviated to "polarity of the data signal").

The data driver 500 receives digital image signals DAT for a row of pixels PX according to the data control signal CONT2 transmitted from the signal controller 600, and selects a grayscale voltage corresponding to each digital image signal DAT to convert the digital image signals DAT into analog data signals. Thereafter the data driver 500 applies the converted analog data signals to corresponding data lines $D_1$ to $D_m$.

The gate driver 400 applies a gate-on voltage Von to the gate lines $G_1$ to $G_n$ according to the gate control signal CONT1 transmitted from the signal controller 600 to turn on switching devices Q connected to the gate lines $G_1$ to $G_n$. Then, the data signals applied to the data lines $D_1$ to $D_m$ are applied to corresponding pixels PX through the turned-on switching devices Q.

A difference between a voltage of the data signal applied to the pixels PX and the common voltage Vcom appears as a charged voltage of the liquid crystal capacitor Clc, that is, a pixel voltage. Alignment of the liquid crystal molecules in the liquid crystal layer 3 varies according to the magnitude of the pixel voltage to change the polarization of light passing through the liquid crystal layer 3. The transmittance of the light is changed by a polarizer attached to the liquid crystal panel assembly 300 according to the change in the polarization.

In units of one horizontal period, which may be written as "1H" and which is the same as one period of the horizontal synchronization signal Hsync and the data enable signal DE, the aforementioned operations are repeatedly performed to sequentially apply the gate-on voltages Von to all the gate lines $G_1$ to $G_n$, so that the data signals are applied to all the pixels PX. As a result, one frame of the image is displayed.

When one frame ends, the next frame starts, and a state of the reverse signal RVS applied to the data driver 500 is controlled, so that the polarity of the data signal applied to each of the pixels is opposite to the polarity in the previous frame (frame inversion). At this time, even in one frame, according to the characteristics of the reverse signals RVS, the polarity of the data signal flowing through the one data line may be inverted (row inversion and dot inversion). In addition, the polarities of the data signals applied to the one pixel row may be different from each other (column inversion and dot inversion).

Now, an exemplary LCD device according to an exemplary embodiment of the present invention will be described in detail with reference to FIGS. 3 to 6.

Figure 3:
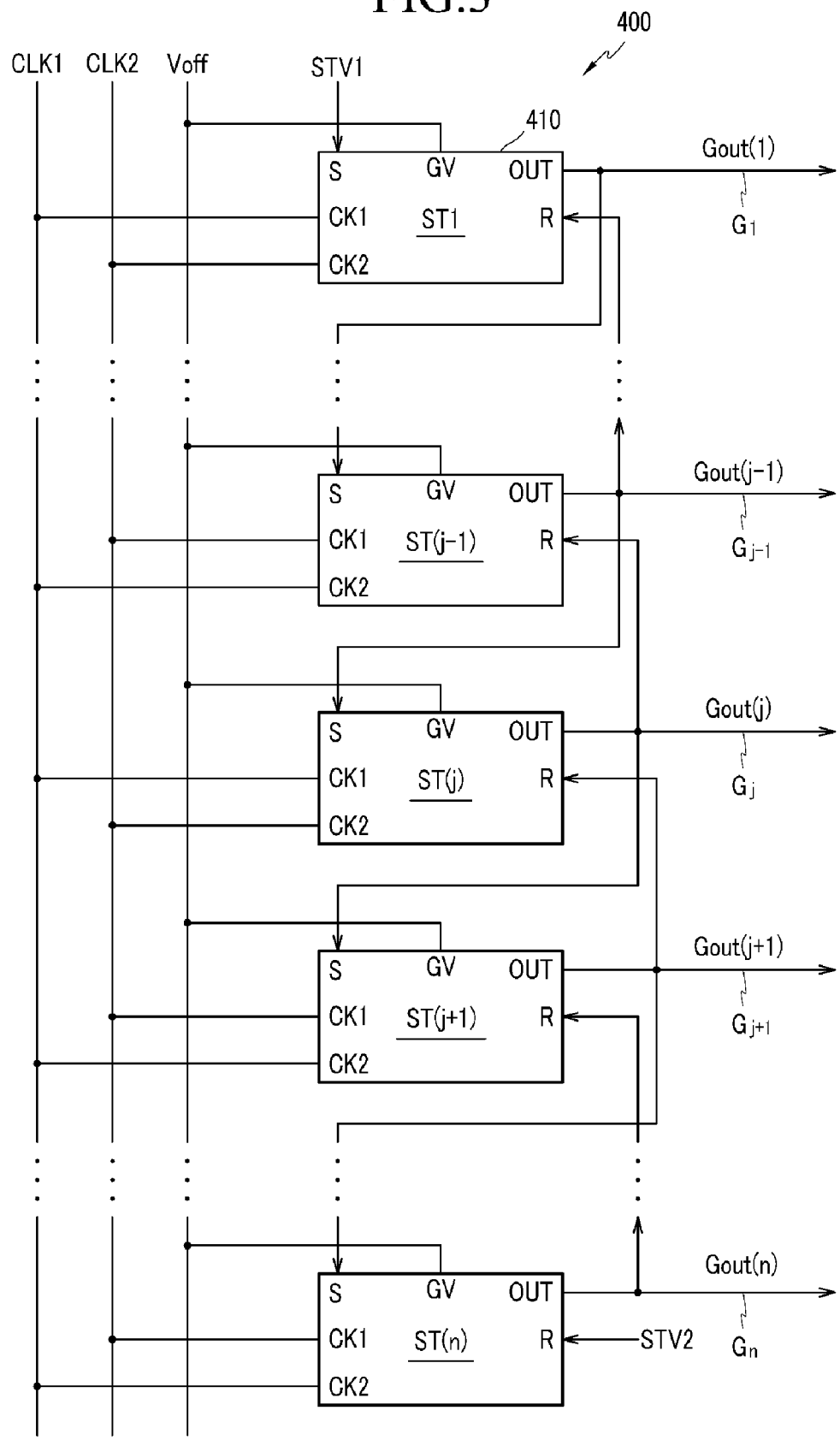
FIG. 3 is a block diagram of an exemplary gate driver according to an exemplary embodiment of the present invention.
Figure 4:
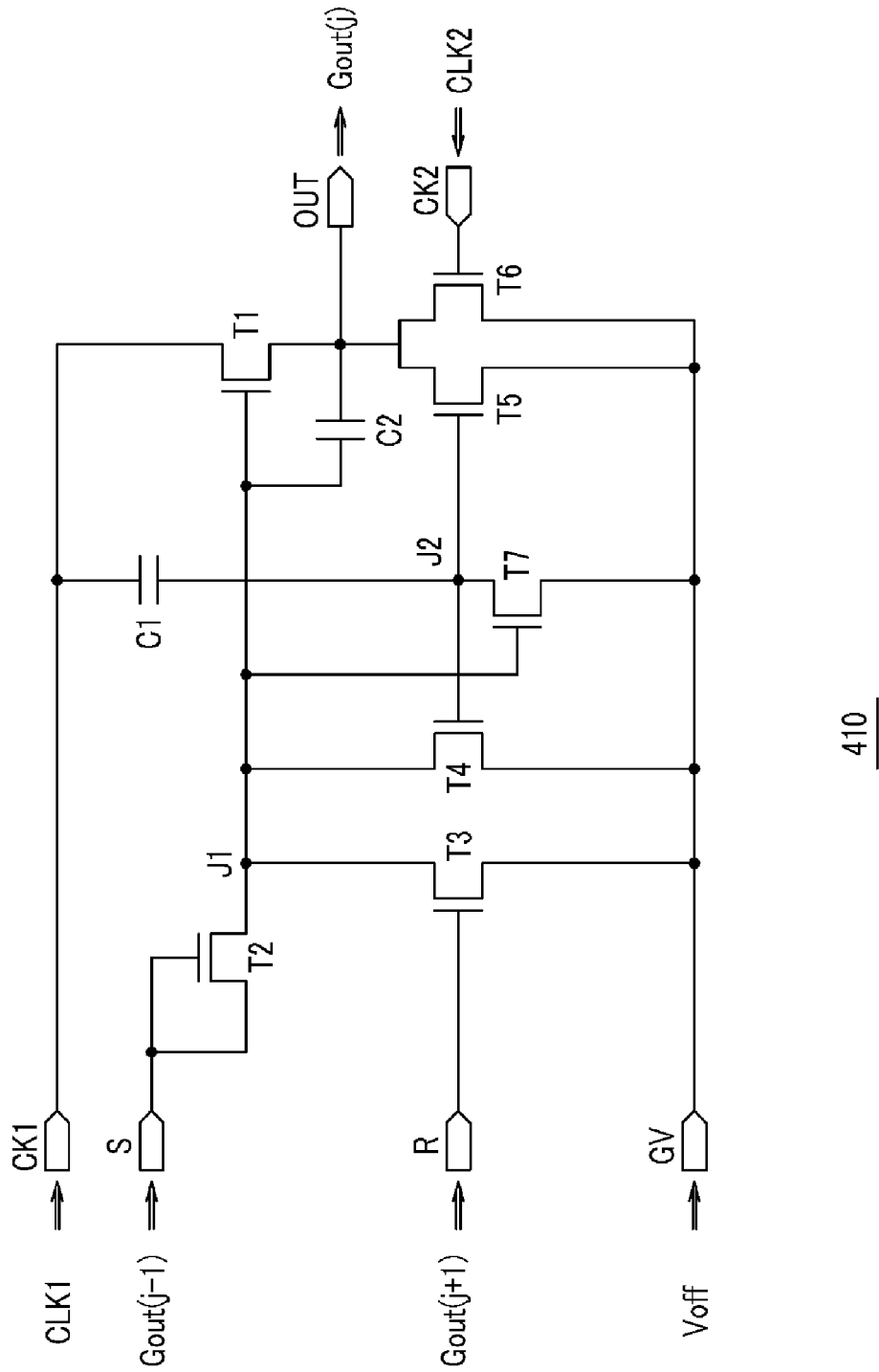
FIG. 4 is an exemplary circuit diagram of a j-th stage of an exemplary shift register for driving an exemplary gate driver in FIG. 3.
Figure 5:
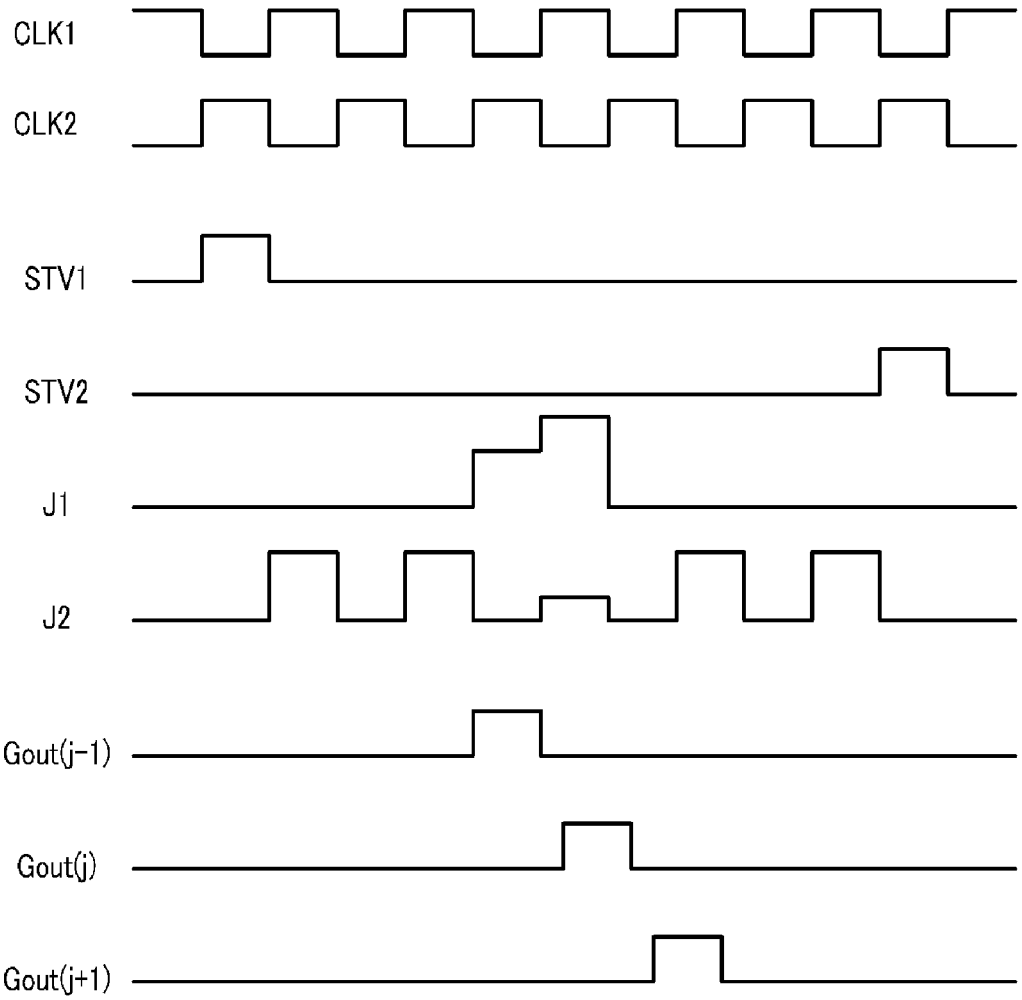
FIG. 5 is a diagram of signal waveforms for driving of the exemplary gate driver in FIG. 3.
Figure 6:
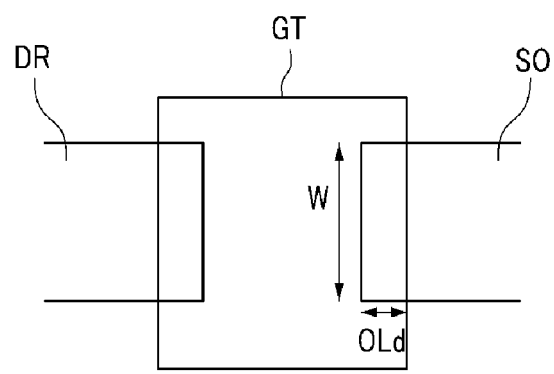
FIG. 6 is a schematic layout view showing the structure of the exemplary transistor in FIG. 4.

FIG. 3 is a block diagram of an exemplary gate driver according to an exemplary embodiment of the present invention, FIG. 4 is an exemplary circuit diagram of a j-th stage of an exemplary shift register for driving an exemplary gate driver in FIG. 3, FIG. 5 is a diagram of signal waveforms for driving the exemplary gate driver in FIG. 3, and FIG. 6 is a schematic layout view showing the structure of the exemplary transistor in FIG. 4.

For convenience of explanation, each magnitude of the forward and backward driving voltages Vfwd and Vbwd and the voltages of the clock signals CLK1 and CLK2 corresponding to a high level will be described as the same as that of the gate-on voltage Von and will be referred to as a high voltage, while each of the magnitudes of the voltages corresponding to a low level will be described as the same as that of the gate-off voltage Voff and will be referred to as a low voltage.

The gate driver 400 illustrated in FIG. 3 is a shift register including a plurality of stages 410 respectively connected to the gate lines $G_1$ to $G_n$. Scan start signals STV1 and STV2, clock signals CLK1 and CLK2, and a gate-off voltage Voff are input to the gate driver 400.

Each stage 410 has a set terminal S, a reset terminal R, a gate voltage terminal GV, a gate output terminal OUT, and clock terminals CK1 and CK2.

In each stage 410, for example a j-th stage ST(j), the set terminal S is applied with a gate output Gout(j−1) of a previous stage ST(j−1), and the reset terminal R is applied with a gate output Gout(j+1) of a next stage ST(j+1). In addition, the clock terminals CK1 and CK2 are respectively applied with the clock signals CLK1 and CLK2. In alternating stages, the clock terminals CK1 and CK2 may be respectively applied with the clock signals CLK2 and CLK1. The output terminal OUT sends out a gate output Gout(j) to a gate line $G_j$ and to a reset terminal of a previous stage ST(j−1) and a set terminal of a next stage ST(j+1). Alternatively, a separate output terminal for sending out carry signals output to the previous and next stages ST(j−1) and ST(j+1) may be further included, and a buffer connected to the output terminal OUT may be further included.

To sum up, each stage 410 outputs a gate output in synchronization with the clock signals CLK1 and CLK2 based on the gate output of the previous stage Gout(j−1) and a gate output of a next stage Gout(j+1).

However, a first stage ST1 of the shift register 400 receives the scan start signal STV1 instead of the gate output of the previous stage as an input, and the last stage ST(n) receives the scan start signal STV2 instead of the gate output of the next stage as an input. The scan start signals STV1 and STV2 respectively have a width of 1H, and are signals having a period of one frame that are respectively input at the start and the end of one frame.

The clock signals CLK1 and CLK2 have a duty ratio of 50%, a period of 2H, and a phase difference of 180° between each other.

At this time, as an example, when the clock terminals CK1 and CK2 of the j-th state ST(j) are applied with the clock signals CLK1 and CLK2, respectively, the clock terminals CK1 and CK2 of the (j−1)-th and (j+1)-th stages ST(j−1) and ST(j+1) adjacent to the j-th stage ST(j) are applied with the clock signals CLK2 and CLK1, respectively.

Referring to FIG. 4, each stage 410 of the gate driver 400 according to an embodiment of the present invention, for example the j-th stage, includes at least one n-type metal oxide semiconductor ("NMOS") transistor T1 to T7 and capacitors C1 and C2. However, a p-type metal oxide semiconductor ("PMOS") transistor may be used instead of the NMOS transistor. In addition, the capacitors C1 and C2 may be parasitic capacitances formed between drain and source electrodes during practical manufacturing processes.

The transistor T2 includes a control terminal and an input terminal connected to the set terminal S, and outputs the previous gate output [Gout(j−1)] to a contact point J1 connected to an output terminal of the transistor T2.

The transistor T3 includes a control terminal connected to the reset terminal R, an input terminal connected to the gate voltage terminal GV, and outputs the gate-off voltage Voff to the contact point J1 connected to an output terminal of the transistor T3.

The transistor T4 and the transistor T5 include control terminals commonly connected to the contact point J2, input terminals connected to the gate voltage terminal GV, and respectively output the gate-off voltage Voff to the contact point J1 and the output terminal OUT.

The transistors T6 and T7 include control terminals respectively connected to the clock terminal CK2 and the contact point J1, input terminals connected to the gate voltage terminal GV, and transmit the gate-off voltage Voff to the contact point J2 and the output terminal OUT, respectively.

The transistor T1 includes a control terminal connected to the contact point J1, an input terminal connected to the clock terminal CK1, and transmits the clock signal CLK1 to the output terminal OUT.

The capacitor C1 is connected between the clock terminal CK1 and the contact point J2, and the capacitor C2 is connected between the contact point J1 and the output terminal OUT.

Operations of a shift register illustrated in FIG. 4 will now be described for the j-th stage as an example.

When the j-th stage ST(j) generates a gate output in synchronization with the clock signal CLK1, the previous and next stages ST(j−1) and ST(J+1) generate gate outputs in synchronization with the clock signal CLK2.

Firstly, when the clock signal CLK2 and the previous gate output Gout(j−1) become high levels, the transistors T6 and T2, which include control terminals respectively connected to the clock terminal CK2 and the set terminal S, are turned on. Thereby, the transistor T2 transmits a high voltage to the contact point J1 to turn on the two transistors T1 and T7, which both have control terminals connected to the contact point J1. Accordingly, the transistor T7 transmits the low voltage from the gate voltage terminal GV to the contact point J2, and the transistor T6 transmits the low voltage from the gate voltage terminal GV to the output terminal OUT. In addition, the transistor T1 is turned on and the clock signal CLK1 from the clock terminal CK1 is output to the output terminal OUT. In this case, since the clock signal CLK1 is the low voltage, the gate output Gout(j) is maintained at the low voltage. Simultaneously, the capacitor C2 is charged with a voltage corresponding to the difference between the high voltage and the low voltage. For example, since generally the high voltage is 17V and the low voltage is −8V, the charged voltage is 25V.

In this case, since the latter gate output Gout(j+1) is at a low level, an input of the reset terminal R is also the low level. Accordingly, the transistors T3, T4, and T5 including the control terminals connected to the reset terminal R and the contact point J2 are turned off.

Subsequently, when the clock signal CLK1 becomes the high level and the clock signal CLK2 becomes the low level, the transistor T6 which includes a control terminal connected to the clock terminal CK2 is turned off. Thereby, the output terminal is interrupted with the gate-off voltage Voff, is connected to the clock signal CLK1, and outputs the high voltage as the gate output Gout(j). In this case, the capacitor C1 is charged with a voltage corresponding to the difference between the high voltage and the low voltage. In addition, a potential of a terminal of the capacitor C2 (i.e., the contact point J1) is increased by the high voltage. Due to parasitic capacitance induced from the overlapping of the control terminal and the output terminal of the transistor T7, the voltage of the junction J1, to which the control terminal of the transistor T7 is connected, increases. Then, the potential of the junction J2, to which the output terminal of the transistor T7 is connected, also increases somewhat as shown.

When the gate output of the next stage Gout(j+1) is at the high level, an input of the reset terminal R is also the high level, and the transistor T3 is turned on to transmit the low voltage from the gate voltage terminal GV to the contact point J1. As a result, the transistor T1 is turned off to block the connection between the clock signal CLK1 and the output terminal OUT.

At the same time, the clock signal CLK2 is at the high level, and accordingly the transistor T6 is turned on to connect the output terminal OUT and the gate-off voltage Voff at the gate voltage terminal GV, so that the output terminal OUT continues to send out the low voltage. In addition, the transistor T7 is turned off due to the low voltage at the contact point J1, and accordingly the contact point J2 is in a floating state to maintain the low voltage, which is the previous voltage.

Thereafter, when the gate output of the next stage Gout(j+1) and the clock signal CLK2 are at the low level, the contact points J1 and J2 are in a floating state, maintaining the previous voltages. At this time, since one terminal of the capacitor C1 is connected to the clock signal CLK1, a voltage of the contact point J2 that is in a floating state varies according to a level of the clock signal CLK1.

Thereafter, the output terminal OUT is connected to the gate-off voltage Voff through the transistor T5 when the voltage of the contact point J2 is the high voltage, that is, when the clock signal CLK1 is at the high level. On the other hand, when the clock signal CLK2 is at the high level, the output terminal OUT is connected to the gate-off voltage Voff through the transistor T6.

After the gate outputs of stages from the first stage ST1 to the last stage ST(n) are generated in accordance with the aforementioned method, the scan start signal STV2 is input to the reset terminal R of the last stage ST(n) to complete operations for one frame.

Now, a design rule of an exemplary apparatus for driving an exemplary LCD according to an exemplary embodiment of the present invention will be described in detail with the reference to FIG. 7 and FIG. 8 as well as FIG. 6.

FIG. 7 is a table showing low temperature test results for various exemplary LCDs, and FIG. 8 is a table comparing the test results of the exemplary LCD before and after the application of the design rule according to an exemplary embodiment of the present invention.

Here, the values for the transistors T4, T5, and T7 shown in the tables refer to the channel width W of the transistors, and their unit is in μm. Also, the value for the capacitor C1 refers to an area A of the capacitor. The overlapping distance Old, as shown in FIG. 6, of each transistor T4, T5, and T7 is about 4 μm, where the source SO overlaps the gate GT. Since C1/T7 and C1/(T4+T5) have different dimensions, they may not strictly be ratios, but for convenience of description they are referred to as ratios. Accordingly, as an example, the ratio of the area of the capacitor C1 to the area of the transistor T7 in the first sample 2.2" CIF is not 39.330, but 28.092. However, the value of C1/T7 as shown in FIGS. 7 and 8 will be termed the ratio of the area of the first capacitor C1 to the channel width of the seventh transistor T7, and the value of C1(T4+T5) as shown in FIGS. 7 and 8 will be termed the ratio of the area of the first capacitor C1 to the sum of the channel widths of the fourth and the fifth transistors T4, T5.

Also, since the gate-on voltage Von of the high voltage is 17V and the gate-off voltage Voff of the low voltage is −8V, the magnitude of the gate-on signal is 25V at room temperature. However, the low temperature test is the test in which the gate-on voltage Von is reduced and the gate-off voltage Voff is increased to reduce the magnitude of the gate on signal Von to 14V, as described above.

Here, whether deterioration is generated or not in the low temperature test is signified in the rightmost row in the table shown in FIG. 7, and it is confirmed that 5 deteriorations were generated among the 24 samples.

According to the analysis of this test, 4 among the 5 deteriorations occur when C1/T7, the ratio of the area of the capacitor C1 to the channel width of the transistor T7, is more than 40, and the factors for the deteriorations will be analyzed as follows.

If the voltage of the contact point J1 (the control terminal) is increased due to the parasitic capacitance between the gate GT and the source SO, which are respectively the control terminal and the output terminal of the transistor T7, this is because the potential of the contact point J2 (the output terminal) is increased. Particularly, the time constant of the current that flows to the source of the transistor T7 is increased at the low temperature compared with room temperature such that the current is slowly decreased, thereby increasing the potential of the contact point J2 by the same amount. Therefore, in the case of the operation of the j-th stage [ST(j)] as above-described, this is because the voltage of the high level of the clock signal CLK1 that is output to the gate output is interrupted by turning on the transistor T5 to transmit the gate-off voltage Voff to the output terminal OUT.

That is, since the potential of the contact point J2 is determined by the ratio of the capacitance of the capacitor C1 to the parasitic capacitance of the transistor T7, and the capacitance is proportional to the area of the capacitor C1, if the area of the capacitor C1 is larger than the area of the transistor T7 by some degree, the potential of the contact point J2 is generally increased. In other words, as shown in the table, when C1/T7, the ratio of the area of the capacitor C1 to the channel width of the transistor T7, is more than 40, the deteriorations are generated.

On the other hand, in the case of 1.2"QQFO4, which is determined as a deterioration, while C1/T7, the ratio of the area of the capacitor C1 to the channel width of the transistor T7, is not over 40, when C1/(T4+T5), the ratio of the area of the capacitor C1 to the sum of the channel widths of the two transistors T4 and T5, is less than 7, the deterioration is generated.

Accordingly, in an exemplary embodiment, the design rule may be that C1/T7, the ratio of the area of the capacitor C1 to the channel width of the transistor T7, is less than 40, and C1/(T4+T5), the ratio of the area of the capacitor C1 to the sum of the channel widths of the two transistors T4 and T5, is more than 7. As shown in the table of FIG. 7, the design rule satisfies at least one of two conditions.

When the new design rule is applied to the LCD that is referred to as 4.0" TMR and the low temperature test is executed, the deterioration is not generated, as shown in FIG. 8. That is, the channel width W of the transistor T7 is increased by 20 μm, from 150 to 170 μm, to cause the value C1/T7, the ratio of the area of the capacitor C1 to the channel width of the transistor T7, to be less than 40, and as a result the deterioration is not generated. As described above, the overlapping distance between the gate and the source of each of the transistors T4, T5, and T7 is about 4 μm.

As described above, the design rule according to an exemplary embodiment of the present invention may be that the value of C1/T7, the ratio of the area of the capacitor C1 to the channel width of the transistor T7, is less than 40, and that the value of C1/(T4+T5), the ratio of the area of the capacitor C1 to the sum of the channel widths of the two transistors T4 and T5, is more than 7. According to the design rule of the exemplary embodiment of the present invention, the deterioration may be remarkably reduced in the low temperature test.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An apparatus for driving a display device, the apparatus including a plurality of stages connected to each other,
    wherein each stage includes first to seventh transistors and first and second capacitors,
    the seventh transistor is connected to one terminal of the first capacitor, and
    a ratio of an area of the first capacitor to a channel width of the seventh transistor is less than 40,
    wherein the first transistor is connected between a first clock terminal and a gate output terminal, and includes a control terminal connected to a first contact point;
    the second transistor includes a control terminal and an input terminal commonly connected to a set terminal, and an output terminal connected to the first contact point;
    the third transistor is connected between the first contact point and a gate voltage terminal, and includes a control terminal connected to a reset terminal;
    the fourth transistor is connected between the first contact point and the gate voltage terminal, and includes a control terminal connected to a second contact point;
    the fifth transistor is connected between the gate output terminal and the gate voltage terminal, and includes a control terminal connected to the second contact point;
    the sixth transistor is connected between the gate output terminal and the first gate voltage terminal, and includes a control terminal connected to a second clock terminal;
    the seventh transistor is connected between the second contact point and the gate voltage terminal, and includes a control terminal connected to the first contact point;
    the first capacitor is connected between the first clock terminal and the second contact point; and
    the second capacitor is connected between the first contact point and the gate output terminal.

2. The apparatus of claim 1, wherein an overlapping distance between a control terminal (gate) and an output terminal (source) of the seventh transistor is about 4 μm.

3. The apparatus of claim 1, wherein the stages are integrated with the display device.

4. The apparatus of claim 1, wherein a ratio of an area of the first capacitor to a sum of channel widths of the fourth and the fifth transistors is more than 7.

5. An apparatus for driving a display device, the apparatus including a plurality of stages connected to each other,
    wherein each stage includes first to seventh transistors and first and second capacitors,
    the fourth and fifth transistors are commonly connected to one terminal of the first capacitor, and
    a ratio of an area of the first capacitor to a sum of channel widths of the fourth and the fifth transistors is more than 7,
    wherein the first transistor is connected between a first clock terminal and a gate output terminal, and includes a control terminal connected to a first contact point;
    the second transistor includes a control terminal and an input terminal commonly connected to a set terminal, and an output terminal connected to the first contact point;
    the third transistor is connected between the first contact point and a gate voltage terminal, and includes a control terminal connected to a reset terminal;
    the fourth transistor is connected between the first contact point and the gate voltage terminal, and includes a control terminal connected to a second contact point;
    the fifth transistor is connected between the gate output terminal and the gate voltage terminal, and includes a control terminal connected to the second contact point;
    the sixth transistor is connected between the gate output terminal and the first gate voltage terminal, and includes a control terminal connected to a second clock terminal;
    the seventh transistor is connected between the second contact point and the gate voltage terminal, and includes a control terminal connected to the first contact point;
    the first capacitor is connected between the first clock terminal and the second contact point; and
    the second capacitor is connected between the first contact point and the gate output terminal.

6. The apparatus of claim 5, wherein an overlapping distance between control terminals (gates) and output terminals (sources) of each of the fourth and the fifth transistor is about 4 μm.

7. The apparatus of claim 5, wherein the stages are integrated with the display device.

8. The apparatus of claim 5, wherein a ratio of an area of the first capacitor to a channel width of the seventh transistor is less than 40.

9. A display device having a gate driver including a plurality of stages connected to each other,
    wherein each stage includes first to seventh transistors and first and second capacitors,
    the seventh transistor is connected to one terminal of the first capacitor, and
    a ratio of an area of the first capacitor to a channel width of the seventh transistor is less than 40,
    wherein the first transistor is connected between a first clock terminal and a gate output terminal, and includes a control terminal connected to a first contact point, the second transistor includes a control terminal and an input terminal commonly connected to a set terminal, and an output terminal connected to the first contact point, the third transistor is connected between the first contact point and a gate voltage terminal, and includes a control terminal connected to a reset terminal, the fourth transistor is connected between the first contact point and the gate voltage terminal, and includes a control terminal connected to a second contact point, the fifth transistor is connected between the gate output terminal and the gate voltage terminal, and includes a control terminal connected to the second contact point, the sixth transistor is connected between the gate output terminal and the first gate voltage terminal, and includes a control terminal connected to a second clock terminal, the seventh transistor is connected between the second contact point and the gate voltage terminal, and includes a control terminal connected to the first contact point, the first capacitor is connected between the first clock terminal and the second contact point, and the second capacitor is connected between the first contact point and the gate output terminal.

10. The display device of claim 9, wherein the overlapping distance between a control terminal (a gate) and an output terminal (a source) of the seventh transistor is about 4 μm.

11. The display device of claim 9, wherein the gate driver is integrated with the display device.

12. A display device having a gate driver including a plurality of stages connected to each other, wherein each stage includes first to seventh transistors and first and second capacitors, the fourth and fifth transistor are commonly connected to one terminal of the first capacitor, and a ratio of an area of the first capacitor to a sum of channel widths of the fourth and the fifth transistors is more than 7, wherein the first transistor is connected between a first clock terminal and a gate output terminal, and includes a control terminal connected to a first contact point;

the second transistor includes a control terminal and an input terminal commonly connected to a set terminal, and an output terminal connected to the first contact point;

the third transistor is connected between the first contact point and a gate voltage terminal, and includes a control terminal connected to a reset terminal;

the fourth transistor is connected between the first contact point and the gate voltage terminal, and includes a control terminal connected to a second contact point;

the fifth transistor is connected between the gate output terminal and the gate voltage terminal, and includes a control terminal connected to the second contact point;

the sixth transistor is connected between the gate output terminal and the first gate voltage terminal, and includes a control terminal connected to a second clock terminal;

the seventh transistor is connected between the second contact point and the gate voltage terminal, and includes a control terminal connected to the first contact point;

the first capacitor is connected between the first clock terminal and the second contact point: and the second capacitor is connected between the first contact point and the gate output terminal.

13. The display device of claim 12, wherein an overlapping distance between a control terminal (gate) and an output terminal (source) of each of the fourth and fifth transistors is about 4 μm.

14. The display device of claim 12, wherein the gate driver is integrated with the display device.

15. A method of manufacturing an apparatus for driving a display device, the method comprising:

forming a plurality of stages within the apparatus, each stage including first to seventh transistors and first and second capacitors, and the seventh transistor is connected to one terminal of the first capacitor in each stage; and, forming each stage including at least one of a ratio of an area of the first capacitor to a channel width of the seventh transistor being less than 40 and a ratio of an area of the first capacitor to a sum of the channel widths of the fourth and the fifth transistors being more than 7;

wherein the first transistor is connected between a first clock terminal and a gate output terminal, and includes a control terminal connected to a first contact point;

the second transistor includes a control terminal and an input terminal commonly connected to a set terminal, and an output terminal connected to the first contact point;

the third transistor is connected between the first contact point and a gate voltage terminal, and includes a control terminal connected to a reset terminal;

the fourth transistor is connected between the first contact point and the gate voltage terminal, and includes a control terminal connected to a second contact point;

the fifth transistor is connected between the gate output terminal and the gate voltage terminal, and includes a control terminal connected to the second contact point;

the sixth transistor is connected between the gate output terminal and the first gate voltage terminal, and includes a control terminal connected to a second clock terminal;

the seventh transistor is connected between the second contact point and the gate voltage terminal, and includes a control terminal connected to the first contact point;

the first capacitor is connected between the first clock terminal and the second contact point;

the second capacitor is connected between the first contact point and the gate output terminal; and deterioration of the stages is not detected in a low temperature test.

* * * * *